(12) United States Patent
Shiraishi

(10) Patent No.: US 7,908,128 B2
(45) Date of Patent: Mar. 15, 2011

(54) METHOD FOR MODELING A TIRE MODEL AND SIMULATION METHOD

(75) Inventor: Masaki Shiraishi, Kobe (JP)

(73) Assignee: Sumitomo Rubber Industries, Ltd., Kobe (JP)

( * ) Notice: Subject to any disclaimer, the term of this patent is extended or adjusted under 35 U.S.C. 154(b) by 643 days.

(21) Appl. No.: 11/979,602

(22) Filed: Nov. 6, 2007

(65) Prior Publication Data

US 2008/0154561 A1  Jun. 26, 2008

(30) Foreign Application Priority Data

Dec. 26, 2006  (JP) .................................. 2006-350160
Apr. 11, 2007  (JP) .................................. 2007-104201

(51) Int. Cl.
*G01N 37/00* (2006.01)

(52) U.S. Cl. .............................................. 703/7; 702/82

(58) Field of Classification Search .................. 703/1, 2, 703/7; 152/548; 73/146; 702/82
See application file for complete search history.

(56) References Cited

U.S. PATENT DOCUMENTS

| 6,199,026 | B1 | 3/2001 | Shiraishi et al. | |
| 6,430,993 | B1 * | 8/2002 | Seta | 73/146 |
| 6,691,566 | B2 * | 2/2004 | Iwasaki et al. | 73/146 |
| 6,697,772 | B2 * | 2/2004 | Mancosu et al. | 703/2 |
| 7,050,952 | B2 * | 5/2006 | Kabe et al. | 703/2 |

FOREIGN PATENT DOCUMENTS

| EP | 1 186 447 A2 | 3/2002 |
| EP | 1 473 559 A2 | 11/2004 |

OTHER PUBLICATIONS

H. Holscher, M. Tewes, N. Botkin, M. Lohndorf, K.H. Hoffmann, E. Quant, "Modeling of Pneumatic Tires by a Finite Element Model for the Development a Tire Friction Remote Sensor" Center for NanoTechnology, University of Munster, Germany, Oct. 28, 2004, 17 pp.*
Cho et al., Advances in Engineering Software, vol. 35, No. 2, pp. 105-113, (2004), XP-002463931.
Pelc, Applied Mathematical Modelling, vol. 31, No. 3, pp. 530-540, (2006), XP-005764110.
Cho et al., Finite Elements in Analysis and Design, vol. 42, No. 14-15, pp. 1248-1257, (2006), XP-005634200.

* cited by examiner

*Primary Examiner* — Dwin M Craig
(74) *Attorney, Agent, or Firm* — Birch, Stewart, Kolasch & Birch, LLP

(57) ABSTRACT

Modeling a tire model used for a computer simulation of a pneumatic tire with a toroidal main body and a tread pattern by setting a three-dimensional main body model by dividing the main body by an integer M not less than 2 equally in a circumferential direction of the tire using a finite number of elements, setting a three-dimensional pattern model by dividing the tread pattern by an integer M greater than N equally in the circumferential direction of the tire using a finite number of elements, coupling the pattern model with the main body model while aligning each tire rotation axis to make a three-dimensional tire model, and correcting by moving nodal points existing on a radially outer surface of the pattern model such that a thickness of the pattern model measured from a radially outer surface of the main body model in a normal direction becomes constant.

10 Claims, 19 Drawing Sheets ical analyzing tire model (mesh model) obtained by dividing a tire into a finite number of small elements. FIG. 19 is a sectional view taken along a tire equatorial plane of a visualized tire model 20. The tire model 20 comprises a toroidal main body model 22 divided into N (N is integer not less than 2) in a circumferential direction of the tire, and a pattern model 24 divided into M (M>N) in the circumferential direction. The main body model 22 is made by dividing a toroidal main body of a pneumatic tire equally in a circumferential direction of the tire using a finite number of elements. Further, the pattern model 24 is made by dividing a circumferentially extending tread pattern of the pneumatic tire equally in a circumferential direction of the tire using a finite number of elements.

METHOD FOR MODELING A TIRE MODEL AND SIMULATION METHOD

BACKGROUND OF THE INVENTION

1. Field of the Invention

The present invention relates to a method for modeling a tire model used for computer simulation of a pneumatic tire and a simulation method, and more particularly, to a method for more precisely analyzing a tread portion of a pneumatic tire.

2. Description of the Related Art

In recent years, various computer simulations of pneumatic tires have been proposed. The simulation is carried out using a numer Since the tread pattern has much effect on the running performance, the tread pattern model 24 is divided into more elements than the main body model 22 to precisely analyze the performance in the simulation. Further, since the number of elements of the main body model 22 is smaller than that of the pattern model 24, there is a merit that calculation time required for the simulation can be shortened.

According to the tire model 20 shown in FIG. 19, however, a thickness of the pattern model 24 measured in the normal direction from a radially outer surface of the body model 22 is not constant based on a difference (M/N=4 in this example) of the division numbers between the main body models 22 and the pattern models 24. That is, the pattern model 24 has a thickness T1 at the nodal point of the body model 22, but has a thickness T2 (T2>T1) at the intermediate position in the circumferential direction of the body model 22. In such a tire model 20, a high ground-contact pressure may be calculated at the portion of the greater thickness T2 of the pattern model 24, but a lower ground-contact pressure may be calculated at the portion of the small thickness T1. Such a calculation result alienates from the actual ground-contact pressure distribution and deteriorates the simulation precision.

In order to solve this problem, it is conceived that the number of divisions N of the main body model 22 in the tire circumferential direction and the number of divisions M of the pattern model 24 are set equal to each other. However, this method increases the number of elements of the tire model 20, and increases the calculation time required for the simulation and a memory consumption amount. If the number of divisions M of the pattern model 24 in the tire circumferential direction and the number N of divisions of the body model 22 are set equal to each other, deformation of the pattern model 24 can not be simulated precisely and in detail.

SUMMARY OF THE INVENTION

The present invention has been accomplished in view of problems above, and it is a main object of the invention to provide a modeling method of a tire model and a simulation method capable of performing a simulation based on a correcting step for moving a nodal point existing on a radially outer surface of pattern model such that a thicknesses of the pattern model measured from a radially outer surface of a body model becomes constant. Therefore, the tire model obtained by the invention can eliminate a conventional inconvenience caused by uneven thickness of the pattern model such as an alienation from the actual ground-contact pressure.

DETAILED DESCRIPTION OF THE PREFERRED EMBODIMENTS

Figure 1:
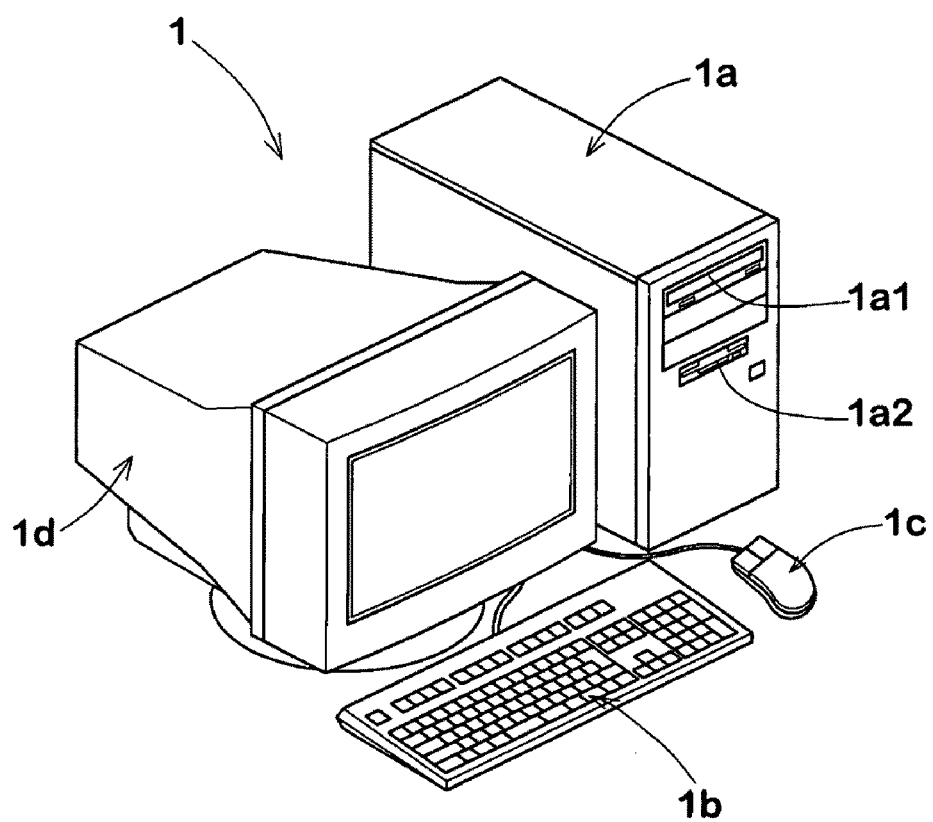
FIG. 1 is a perspective view showing one example of a computer system.

An embodiment of the present invention will be explained below. The invention provides a method for modeling a tire model used for computer simulation (numerical analysis) of a pneumatic tire by a computer system 1 as shown in FIG. 1. In the simulation, preferably, a finite element method or a finite volume method is used.

The computer system 1 includes a main computer 1*a*, a keyboard 1*b* and a mouse 1*c* as input means, and a display 1*d*. The main computer 1*a* includes a CPU, a ROM, a working memory, a mass storage (those are not shown), and drives 1*a*1 and 1*a*2. Processing procedure (program) for executing a later-described method is preliminarily stored in the mass storage.

Figure 2:
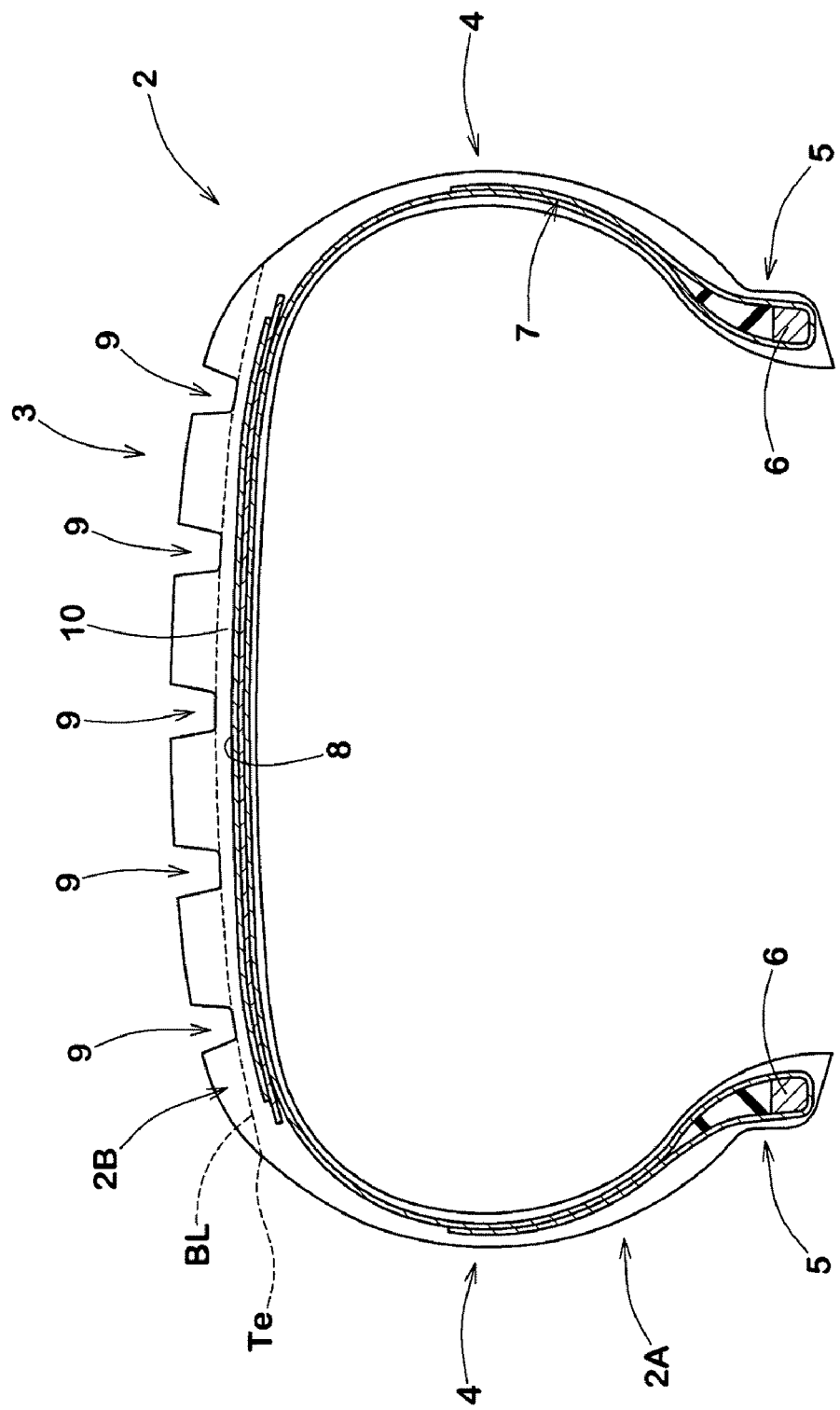
FIG. 2 is a sectional view of a pneumatic tire to be analyzed

FIG. 2 is a sectional view of a pneumatic tire 2 to be simulated. A pneumatic tire to be simulated may not exist actually. That is, such a tire may have already been prototyped, or may be an envisioned tire. The pneumatic tire 2 comprises a tread portion 3 with a tread rubber which comes into contact with a road surface, a pair of sidewall portions 4 extending from both sides of the tread portion 3 radially inward of the tire, and a bead portion 5 which is provided at inner side of each sidewall portion 4 and in which a bead core 6 is embedded. The pneumatic tire 2 also comprises a carcass 7 comprising a carcass cord layer extending between the pair of bead cores 6 and 6, and a belt layer 8 disposed radially outside of the tire and inside of the tread portion 3.

The tread portion 3 of the pneumatic tire 2 is provided with a plurality of longitudinal grooves 9 extending continuously in a circumferential direction of the tire. With this, a tread pattern 2B is formed on the radially outer surface of the tread portion 3.

If a phantom groove-bottom line BL smoothly connecting groove bottoms of the longitudinal grooves 9 is defined as a reference, the pneumatic tire 2 can be divided into a toroidal main body 2A which does not include the longitudinal grooves 9 consisting of a tire radially inward portion of the phantom groove-bottom line BL, and a tread pattern (longitudinal groove 9) consisting of a radially outward portion of the tire than the phantom groove bottom line BL. In this embodiment, the main body 2A includes the sidewall portions 4, the bead portions 5, the carcass 7, the belt layer 8 and the tread base rubber 10 disposed inward of the groove-bottom of the longitudinal groove 9. A boundary between the main body 2A and the tread pattern 2B is not limited to the phantom groove-bottom line BL, and a radially outer surface of the belt layer 8 may be defined as a reference, for example.

Figure 3:
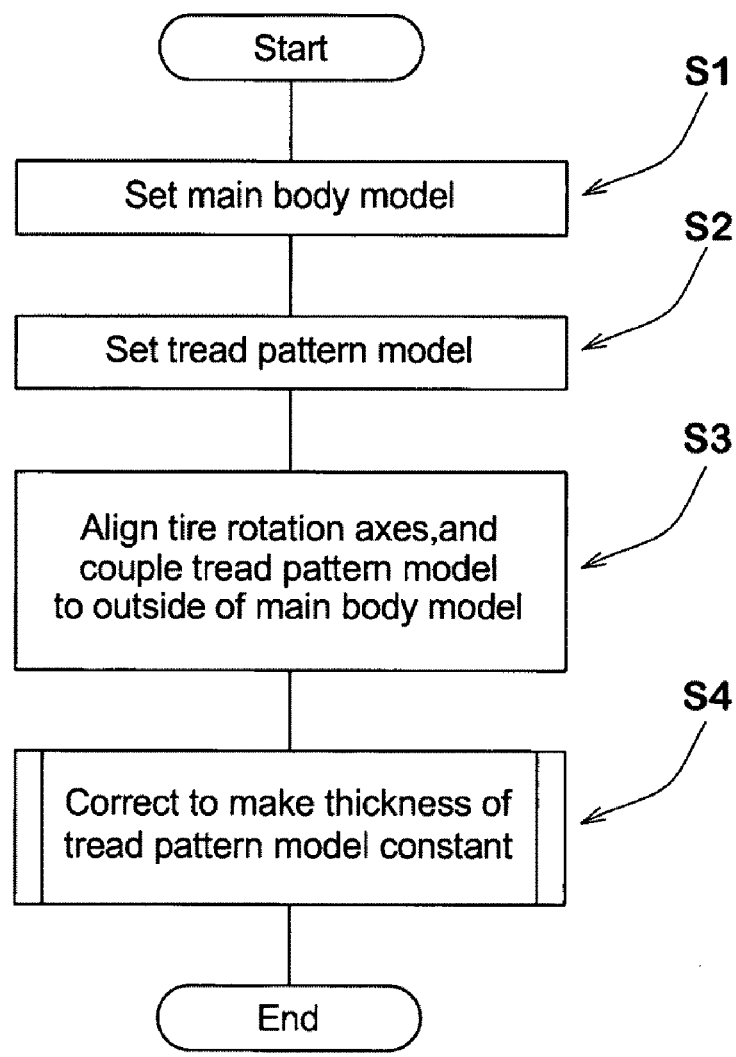
FIG. 3 is a flowchart showing one example of modeling method of the present invention.

FIG. 3 is a flowchart of one example of a modeling method of a tire model according to the present invention. First, in this embodiment, a step for setting a three-dimensional body model 11 obtained by equally dividing the tire body portion 2A of the pneumatic tire 2 into N (N is an integer not less than 2) in the circumferential direction of the tire using the a finite number of elements (step S1).

Figure 4:
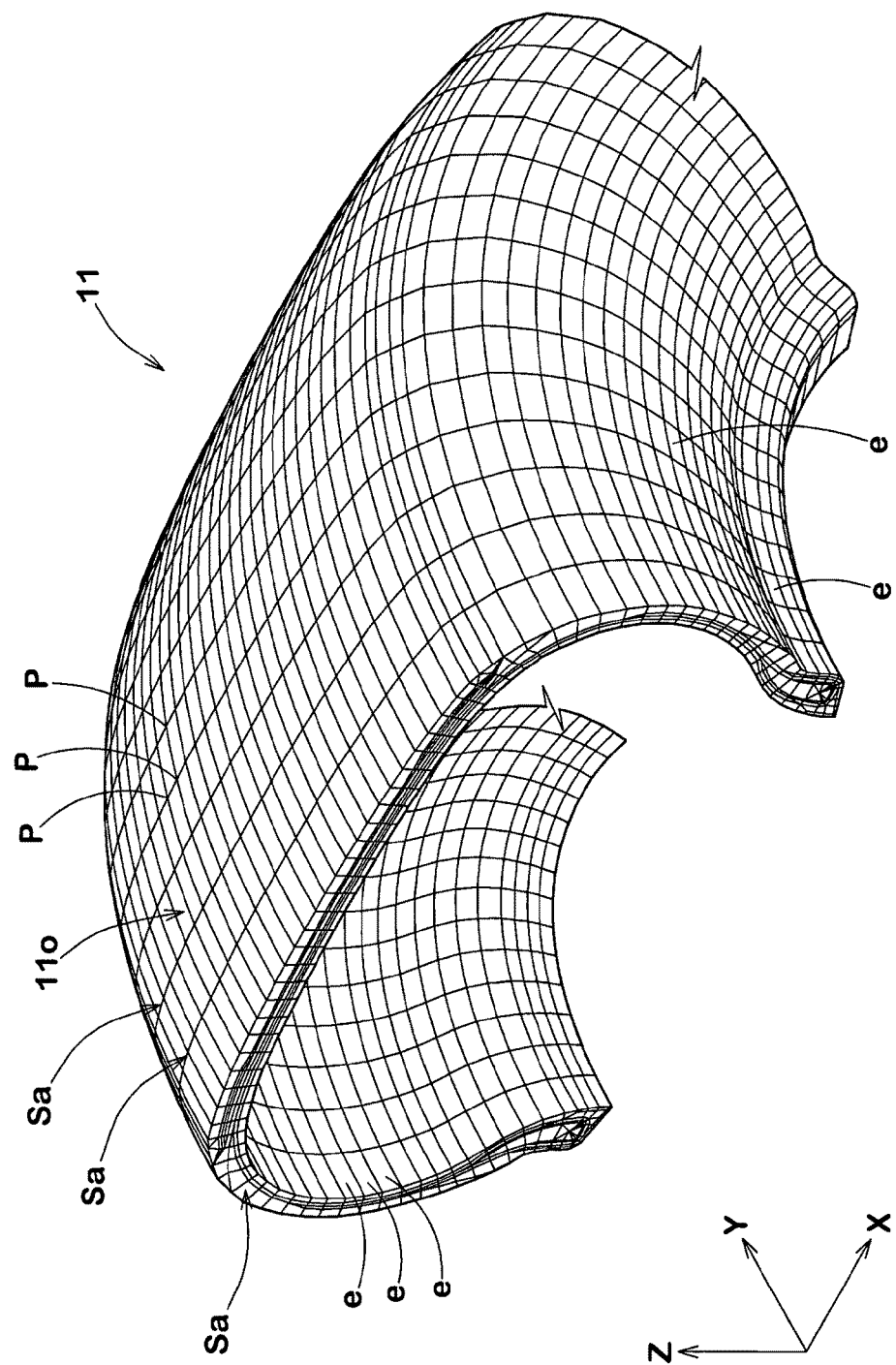
FIG. 4 is a partial perspective view showing one example of a main body model.

FIG. 4 is a partial perspective view of the visualized main body model 11. The body model 11 is divided into the finite number of elements e. In this embodiment, the main body model comprises N number of cross sections sa disposed at equal angles around the tire rotation axis. Each cross section sa is the same shape and has nodal points P at the same position. Further, each nodal point P on the cross section sa adjacent in the tire circumferential direction is connected to each other to form an annular shape. Therefore, on the longitudinal cross section which is in parallel to the tire equatorial plane, an outline of the radially outer surface of the main body model 11 is a regular polygon having N number of angles.

The number of divisions N of the main body model 11 in the circumferential direction of the tire is not especially limited. However, if the number of divisions N is too small, there is an adverse possibility that the simulation precision is deteriorated, and if the number is excessively large, the calculation time is largely increased. In view of such circumstances, the number of divisions N is preferably not less than 60, more preferably not less than 90, and not more than 360, and more preferably not more than 240.

Next, in this embodiment, a step for setting a three-dimensional pattern model 12 obtained by equally dividing the tread pattern 2B into M in the circumferential direction of the tire using a finite number of elements is carried out (step S2). Here, M is an integer greater than N.

Figure 5:
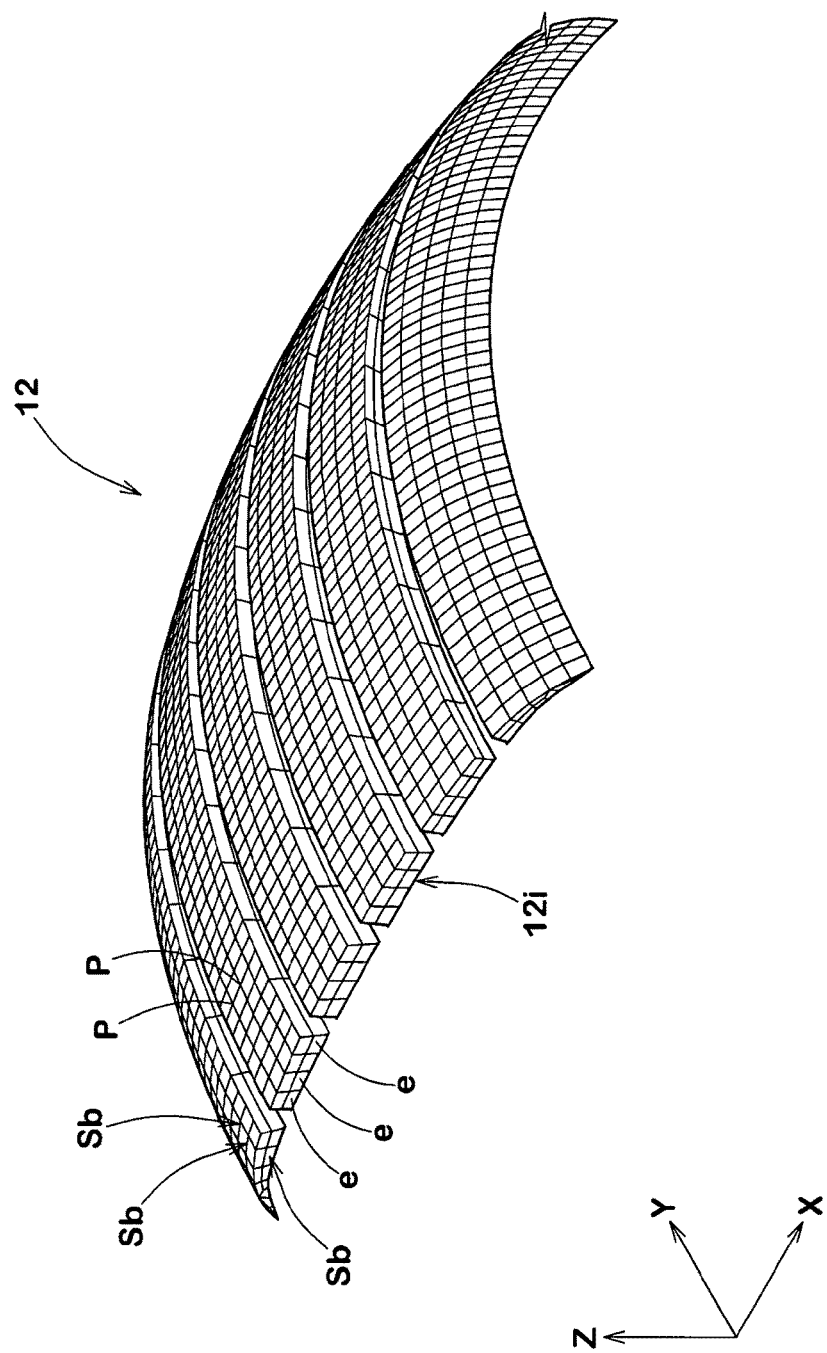
FIG. 5 is a partial perspective view showing one example of a pattern model.

FIG. 5 is a partial perspective view of the visualized pattern model 12. The pattern model 12 is divided into the finite number of elements, and the pattern model 12 is provided at its outer surface in the radial direction of the tire with five longitudinal grooves. The pattern model 12 of this embodiment, however, is not provided with a lateral groove.

The pattern model 12 has an annular shape. In this example, the pattern model 12 comprises M number of cross sections sb disposed at equal angles around the tire rotation axis. Each cross section sb is the same shape and has nodal points P at the same position. Further, each nodal point P on the cross section sb adjacent in the tire circumferential direction is connected to each other to form an annular shape. Therefore, like the main body model 11, if one two-dimensional cross section is obtained, the pattern model 12 can easily be defined by developing (copying) this in the circumferential direction of the tire.

On the tread pattern 2B, the ground-contact action and the releasing action with respect to a road surface are repeated and thus, a greater and more complicated deformation is generated in the tread pattern 2B as compared with the main body 2A. To simulate such a deformation of the tread pattern 2B in more detail, the pattern model 12 is divided more than the main body model 11 in the circumferential direction of the tire. That is, the circumferential length of each element e of the pattern model 12 is shorter than that of the main body model 11.

The number of divisions M of the pattern model 12 in the tire circumferential direction is not especially limited, but the number of divisions M is too small, a deformation of the tread pattern 2B can not be reproduced precisely and the simulation precision is deteriorated, and if the number of divisions M is excessively large, the number of elements is largely increased and the calculation time is largely increased. In view of such circumstances, it is preferable that the number of divisions M is not less than 120, more preferably not less than 180, and not more than 540 and more preferably not more than 360.

As to the element e, a three-dimensional solid element such as a prism element and a hexahedron element are preferably used for a rubber portion, a two-dimensional plane element is preferably used for a cord layer such as the carcass 7 and the belt layer 8, and rigid element is preferably used for the bead core 6. In accordance with a convention of the finite element method, physical property such as elastic modulus and density of rubber or cord layer expressed by the method are defined in each element e. Such information is stored in the mass storage of the computer 1 together with the coordinates of the nodal points P of the elements.

Figure 6:
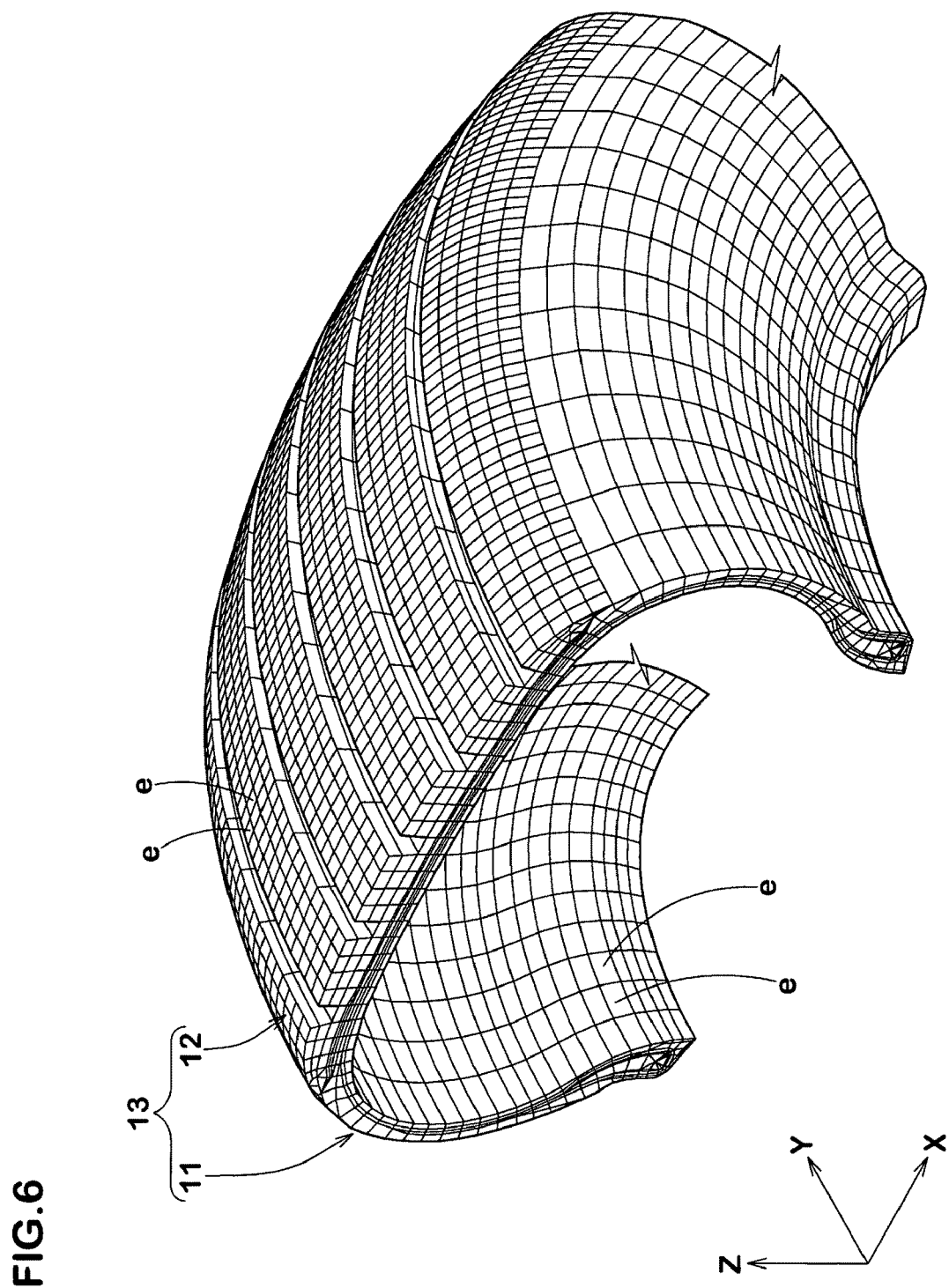
FIG. 6 is a partial perspective view showing one example of a tire model.
Figure 7:
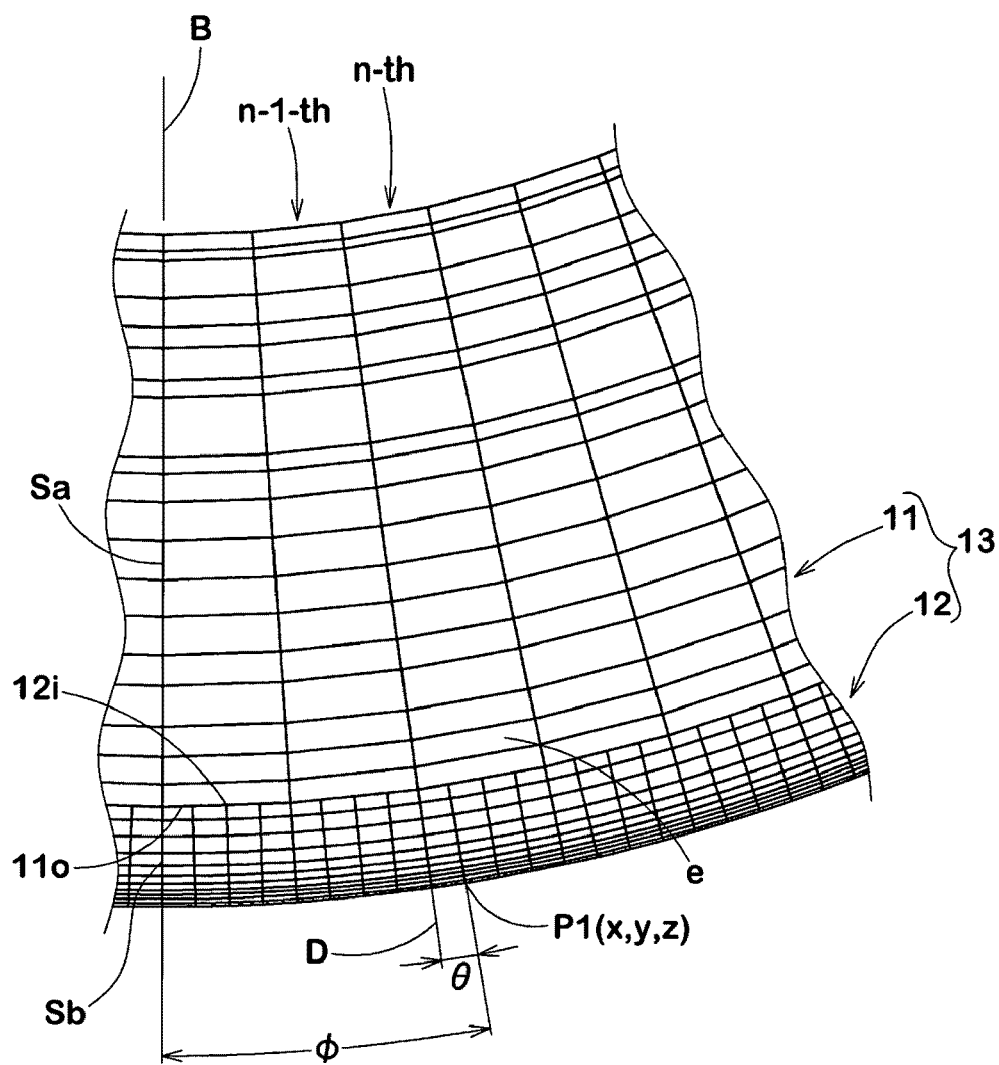
FIG. 7 is a partial side view of the tire model

Next, the pattern model 12 is coupled with radially outer side of the main body model 11 such that their tire rotation axes and equator positions are aligned to each other, and a three-dimensional tire model 13 is set (step s3) as shown in FIG. 6 and FIG. 7 which is a partial side view of FIG. 6. A radially outer surface 11o of the main body model 11 and a radially inner surface 12i of the pattern model 12 are coupled to each other in terms of a numeric value. The coupling in terms of a numeric value means that a plane or nodal points forming the outer surface 11o of the main body model 11 are defined with respect to a plane or nodal points forming the inner surface 12i of the pattern model 12 such that their relative distances are not changed. This condition is maintained also when the tire model 13 is deformed.

Figure 8:
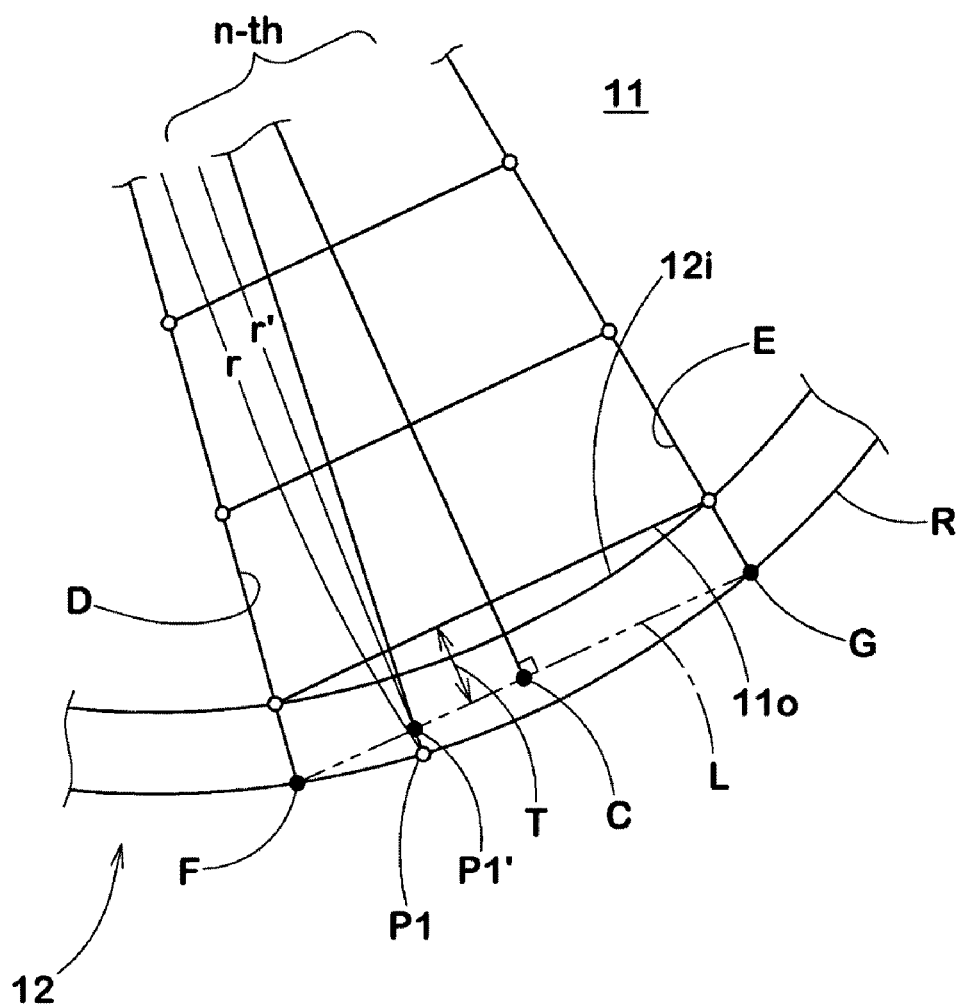
FIG. 8 is a schematic partial enlarged view of the tire model.

FIG. 8 is a simplified sectional view of the tire model 11 which is in parallel to the tire equatorial plane. In this embodiment, a correcting step (step 4) for moving at least one nodal point P1 located on the radially outer surface of the pattern model 12 such that a thickness T of the pattern model 12 becomes constant (move a nodal point from P1 to P1'). Here, the thickness T of the pattern model 12 is a value measured from the radially outer surface 11o of the body model 11 as a reference in the normal direction.

Figure 9:
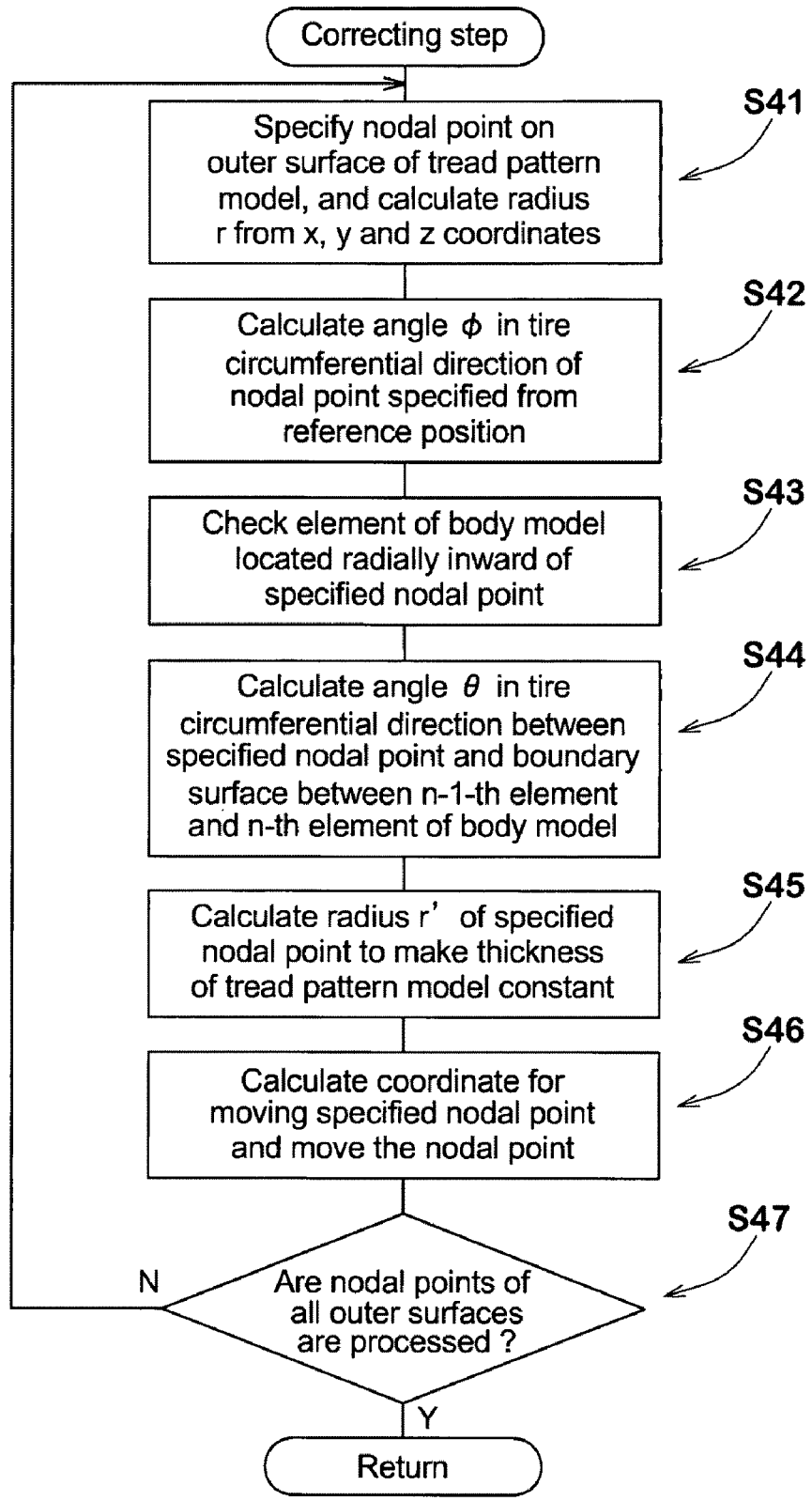
FIG. 9 is a flowchart showing one example of correcting step of the present invention.

This correcting step is carried out based on a flowchart shown in FIG. 9 for example. In this embodiment, concerning the tire model 13, coordinate of an intersection between the tire rotation axis and the tire equatorial plane are defined as an origin (0, 0, 0), a tire widthwise direction is set as an x axis, a vertical direction is set as a y axis and a longitudinal direction is set as a z axis.

First, in this embodiment, one nodal point P1 of the radially outer surface of the pattern model 12 is selected, and a radius r of the nodal point P1 from the tire rotation axis is calculated based on the y and z coordinates of the nodal point P1 (step S41). More specifically, the radius r is calculated in accordance with the following equation by the coordinates of the nodal point P1:

$$r = \sqrt{(y^2 + z^2)}$$

Next, as shown in FIG. 7, an angle $\phi$ formed between a reference position B and the selected nodal point P1 in the tire circumferential direction is calculated in accordance with the following equation (step s42).

$$\phi = (360 \times i)/M$$

Here, in this embodiment, the reference position B is defined on a cross section where the cross section sa of the main body model 11 and the cross section shape sb of the pattern model 12 match with each other. Further, M is the number of divisions of the pattern model 12 in the tire circumferential direction, i is an integer, the initial value of i is 0 and the maximum value thereof is (M−1), and i is the number of elements of the pattern model 12 from the reference position B to the nodal point P1.

Next, the element e of the body model 11 located radially inward of the selected nodal point P1 is checked (step s43). Here, if the element e of the body model 11 located radially inward of the nodal point P1 is located at n-th position from the reference position B, the n is obtained by rounding up the first decimal place of n' which is calculated in accordance with the following equation:

$$n' = \phi \cdot N/360$$

wherein, N is the number of divisions of the body model 11 in the circumferential direction of the tire.

Next, an angle θ in the circumferential direction of the tire from the nodal point P1 to a boundary surface D between an element located at (n−1)-th position of the main body model 11 from the reference position B and an element located at the n-th position is calculated in accordance with the following equation:

$$\theta = \phi - \{360(n-1)/N\}$$

Next, a new radius r' of the nodal point P1 for making the thickness T of the pattern model 12 constant is calculated using the angle θ (step s45). That is, as shown in FIG. 8, in order to make the thickness T of the pattern model 12 constant, it is necessary that the nodal point P1 is moved inward of the radial direction up to a straight line L which passes through points F and G and is in parallel to the outer surface 11o of the n-th element of the main body model 11. Here, the point F is an intersection between a phantom circle R passing through the selected nodal point P1 and the boundary surface D of the tire model 13. Similarly, the point G is an intersection between the phantom circle R, and the boundary surface E between the n-th body model element from the reference position B and the n+1-th element of the main body model 11.

Figure 10:
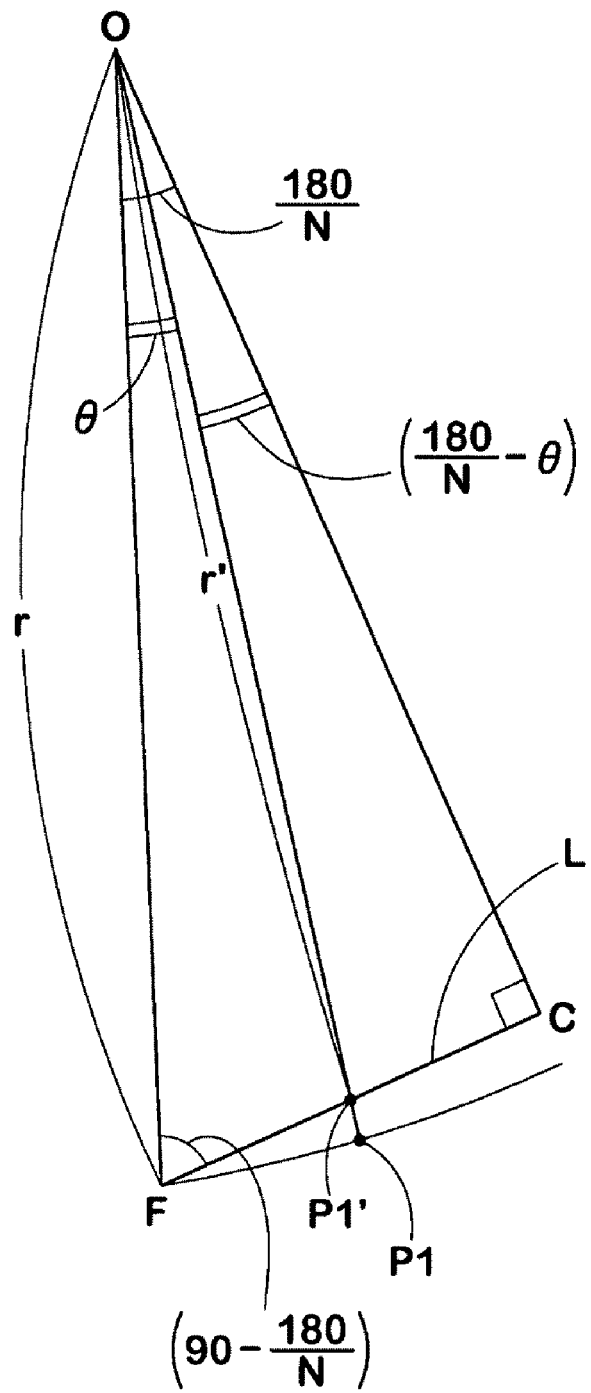
FIG. 10 is a schematic diagram of FIG. 8.

FIG. 10 is a schematic diagram of a triangular OCF shown in FIG. 8. The point c is a normal extended from the origin O to the straight line L. As apparent from FIG. 10, the following equation is established:

$$r \cdot \cos(180/N) = r' \cdot \cos\{(180/N) - \theta\}$$

If the above equation is dissolved based on r', the following equation can be obtained. With this equation, a new radius r' after the nodal point P1 moves can be calculated (step s46).

$$r' = r/\{\cos\theta + \sin\theta/\tan(90 - 180/N)\}$$

Next, new coordinates (x', y', z') of a nodal point P1' after the nodal point P1 moves is obtained by the following equation, and the nodal point P1 is moved to that position:

$$x' = x$$

$$y' = r' \cdot \sin\phi$$

$$z' = r' \cdot \cos\phi$$

It is determined whether all of nodal points are processed (step s47), and if the answer is NO (N in step s47), a nodal point on the outer surface of the pattern model 12 is specified, and the step S41 and subsequent steps are repeated. When the all of nodal points are processed (y in step s47), the processing is completed.

As explained above, if the nodal point P appearing on the radially outer surface of the pattern model 12 is moved radially inward of the tire, the thickness of the pattern model 12 measured on the outer side in the normal direction from the radially outer surface of the body model 11 can be made constant. Therefore, if a rolling simulation is carried out while providing the tire model 13 with a predetermined condition and various physical quantities (e.g., distribution of the ground-contact pressure) are obtained from the pattern model 12 through the simulation, a result of precise simulation can be obtained.

The present invention can variously be modified, and other embodiments will be explained below.

Figure 11:
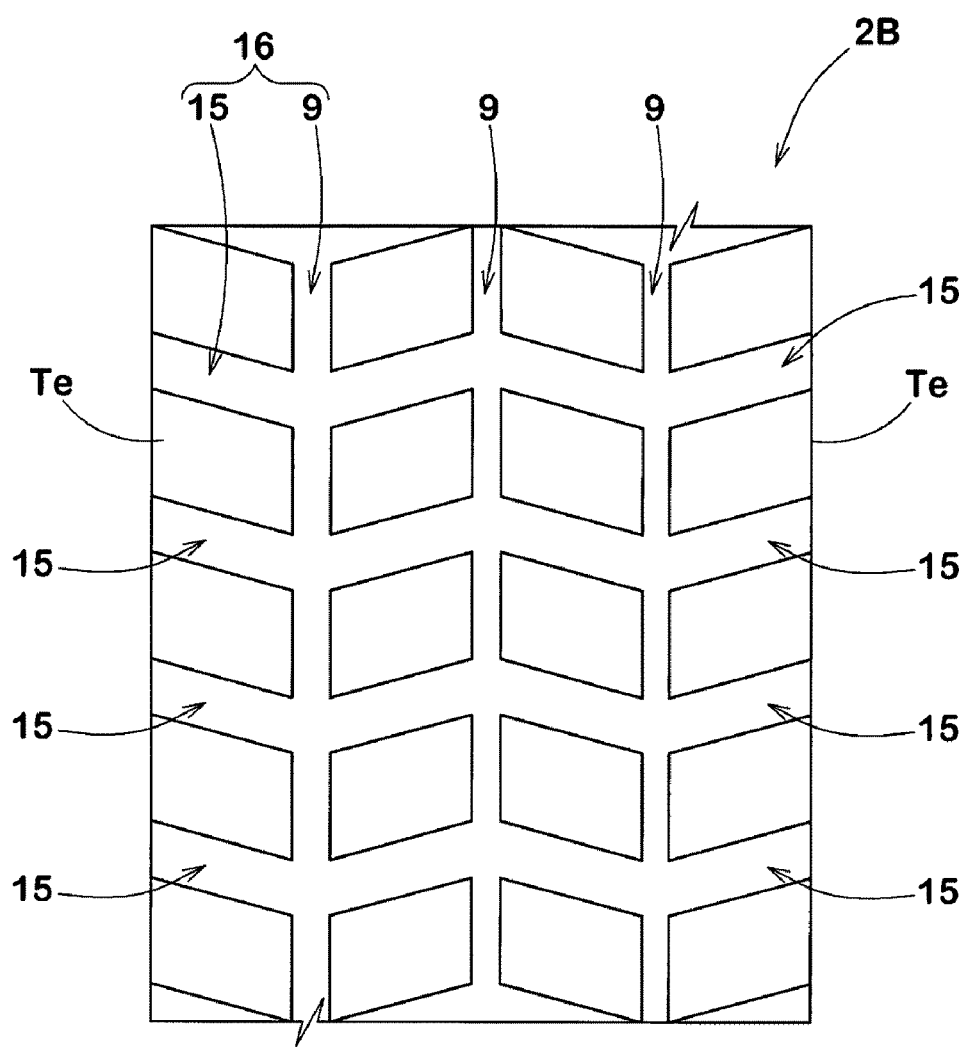
FIG. 11 is a plan view of a tread pattern.

FIG. 11 is a development diagram of another embodiment of a tread pattern 2B of a pneumatic tire to be analyzed. The tread pattern 2B is provided with tread groove 16 including three longitudinal grooves 9 extending in the circumferential direction of the tire and lateral grooves 15 extending in a direction intersecting with the longitudinal grooves 9. In this embodiment, each longitudinal groove 9 continuously extends straightly in the circumferential direction. The lateral groove 15 extends across an area between the longitudinal grooves 9, and between the axially outermost longitudinal groove 9 and the tread end Te. The tread end Te is where the groove-bottom line BL intersects with an outer surface of the tire as shown in FIG. 2. The longitudinal groove 9 and the lateral groove 15 include narrow slots and sipes (not shown).

Figure 12:
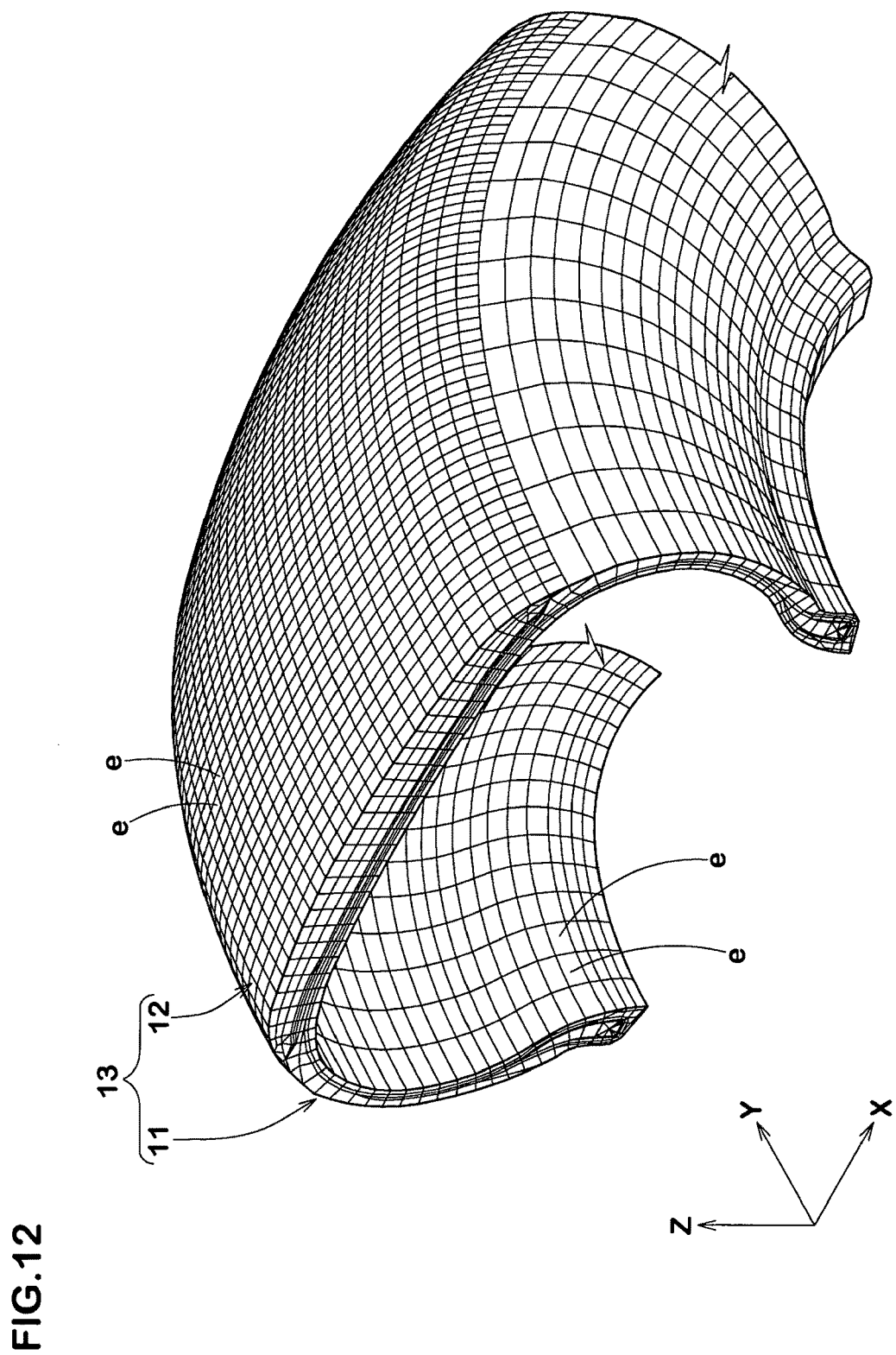
FIG. 12 is a partial perspective view of a visualized another example of the tire model.
Figure 13:
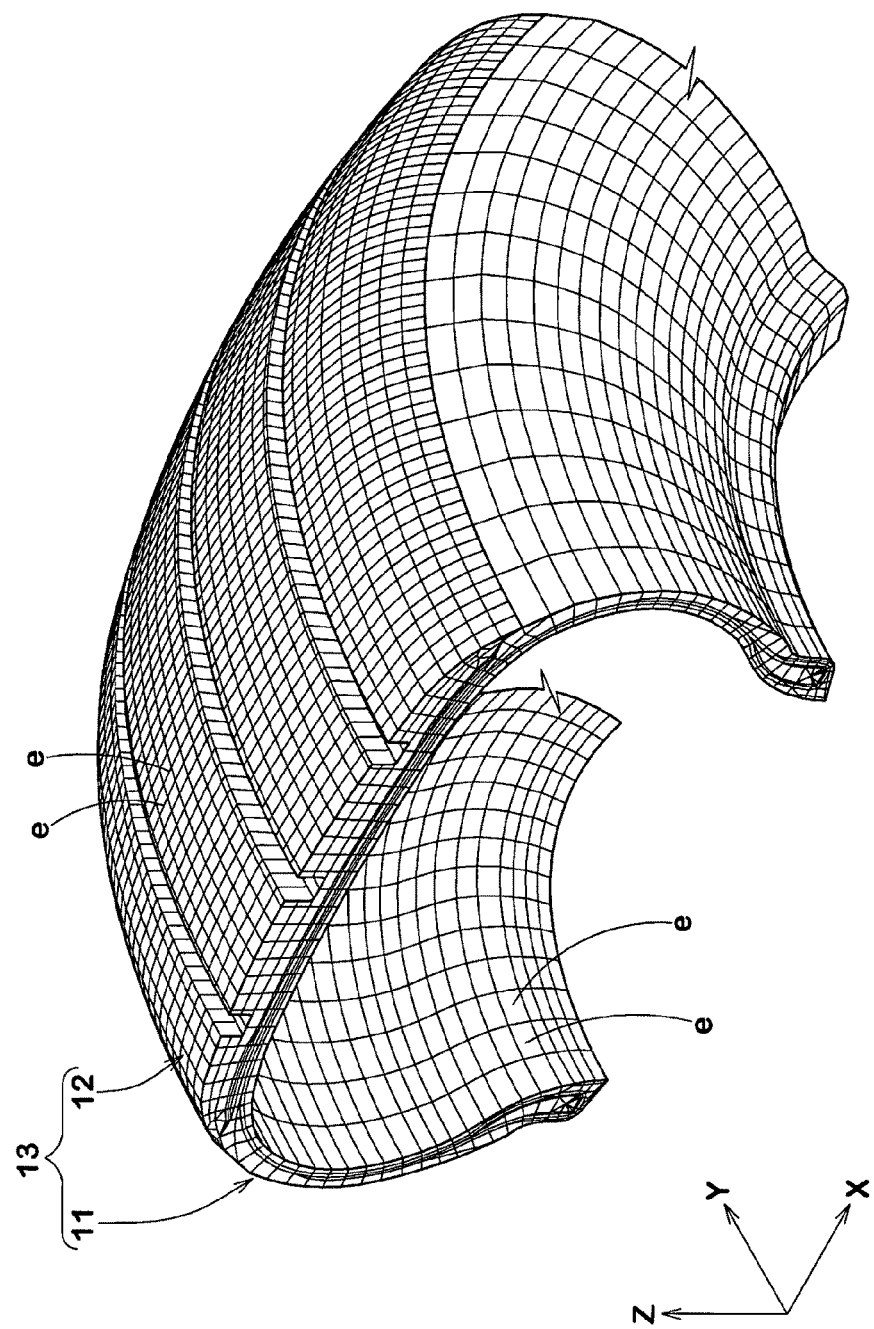
FIG. 13 is a partial perspective view of a visualized another example of the tire model.
Figure 14:
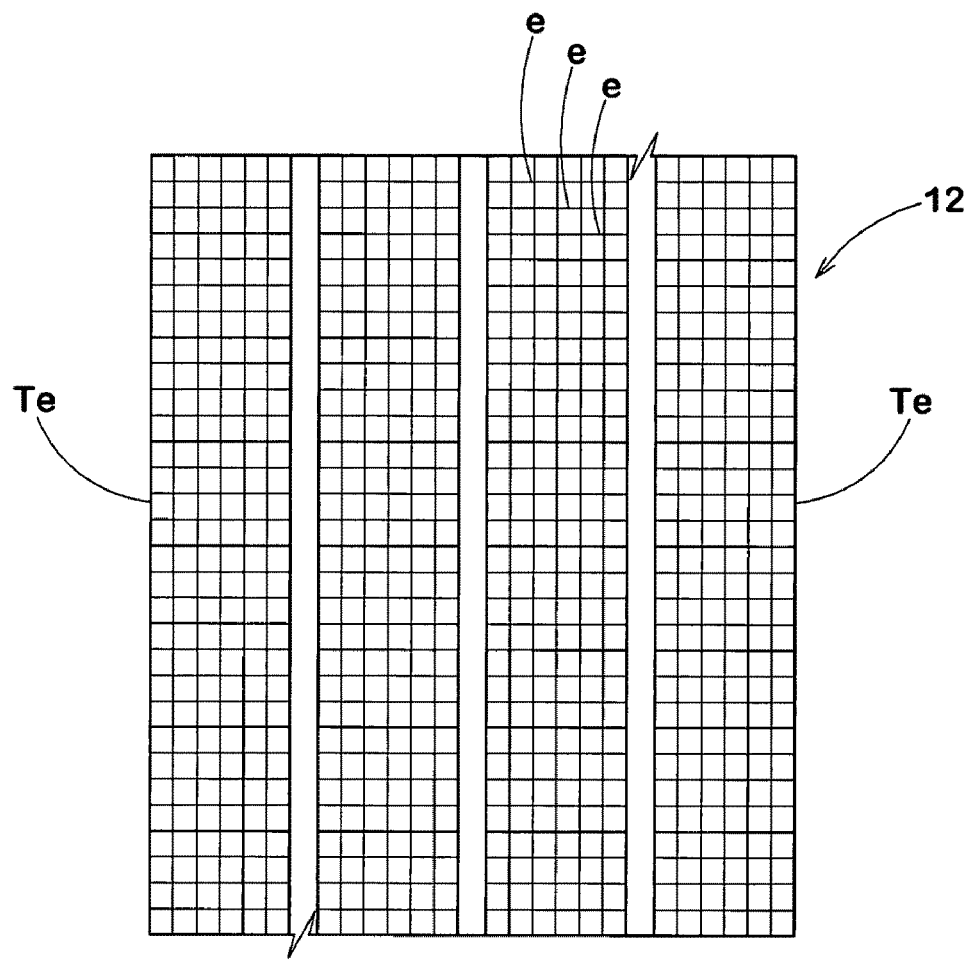
FIG. 14 is a development view of the pattern model of FIG. 13.

In this embodiment, a pattern model 12 in which at least one tread groove 16 is omitted is set to shorten the model forming time. FIGS. 12 and 13 shows examples of the tire model 13 having the pattern model 12 in which the tread groove is omitted. FIG. 14 is a plan view of the pattern model 12 shown in FIG. 13.

Here, the "omission" of the tread groove 16 means that a three-dimensional space occupied by the tread groove 16 of the pneumatic tire is filled with an element of rubber, and this portion is replaced by a plain tread surface having no groove. Therefore, when the pattern model 12 is to be set, steps for setting complicated three-dimensional groove shape is reduced by omitting at least one of the tread grooves 16 from the pneumatic tire 2 and thus, time and labor for forming a tire model can be reduced.

In a computer simulation using the finite element method, physical property (e.g., rubber elastic modulus, density and/or vibration damping factor) of the tread rubber of a pneumatic tire to be simulated are defined as they are in the pattern model. However, in the pattern model 12 formed in this embodiment, a space occupied by the longitudinal grooves 9 and/or lateral grooves 15 is replaced by rubber. Thus, the shape thereof is different from the tread pattern of the pneumatic tire 2 to be actually simulated and with this, the rigidity becomes greater than that of the original tire 2. Therefore, if the physical property of the original tread rubber is defined as it is in various elements e of the pattern model 12, the rigidity of the pattern model 12 is excessively evaluated, and the simulation precision is deteriorated.

As in this embodiment, when at least one of the tread grooves 16 is omitted and the pattern model 12 is set, a rubber property smaller than the physical property of the tread pattern of the pneumatic tire 2 to be simulated is defined. More specifically, a rubber property calculated based on the rubber property of the tread pattern of the pneumatic tire 2 and the capacity of the omitted tread groove 16 is defined in each element e of the pattern model 12.

As a preferred example, it is preferable that a physical property defined in each element e of the pattern model 12 is calculated by multiplying a physical property of the tread rubber of the pneumatic tire 2 to be analyzed by a constant $\alpha(<1)$ obtained by the following equation based on the capacity of the omitted tread groove 16:

$$\alpha=(1-a)/(1-b)$$

wherein "a" is a ratio of a total capacity of the tread groove 16 to a capacity of the entire tread pattern 2B in the pneumatic tire 2 to be simulated (specified by embedding all the tread grooves 16), and "b" is a total capacity ratio of the tread groove to a capacity of the entire pattern model 12 (specified by embedding all grooves) in the tire model 13.

More specifically, elastic modulus j', density ρ' and vibration damping factor δ' of each element e of the pattern model 12 can be calculated in accordance with the following equations using elastic modulus j, density ρ and vibration damping factor δ of rubber of the tread pattern 2B in the pneumatic tire 2 to be simulated:

$$J'=\alpha \cdot J$$

$$\rho'=\alpha \cdot \rho$$

$$\delta'=\alpha \cdot \delta$$

when the tire model 13 is to be set, as the tread grooves 16 are omitted, the constant α becomes smaller. That is, as the tread grooves 16 are omitted, the elastic modulus is calculated smaller in accordance with the capacity, and its value is defined in each element e of the pattern model 12. Therefore, rigidity of the pattern model 12 enhanced by omitting the tread groove 16 is offset by reducing the elastic modulus and density defined in the element e.

In this embodiment, elastic modulus J', density ρ' and damping factor δ' calculated above are defined in all of the elements e of the pattern model 12. Therefore, influence of the omitted tread groove 16 is incorporated averagely in the physical property of the elements e of the pattern model 12 (average property).

Further, in the numerical analysis of a pneumatic tire, a rubber portion of the pattern model 12 is usually handled as an incompressibility material whose volume is not varied within an elastic limit. In a material whose volume is not varied, the Poisson's ratio which is a ratio of distortion in a load direction when a tensile load is applied and a distortion in a direction perpendicular to the load at the right angles is 0.5. Therefore, in the conventional simulation of tires, 0.5 Poisson's ratio is defined for an element corresponding to the rubber portion.

According to the tire model 13 of this embodiment, since some of the tread grooves 16 are omitted, there is an adverse possibility that a large deformation of a tread rubber generated such as to close the tread groove 16 can not be reproduced precisely. Hence, the Poisson's ratio being greater than 0 and less than 0.50 may be defined in all of elements of the pattern model 12 so that a larger volume change of an element corresponding to the rubber portion is exceptionally permitted.

A concrete value of the Poisson's ratio can appropriately be determined while taking a volume change into account depending upon a required simulation. However, if the value is excessively high, there is an adverse possibility that the volume change of the element can not be expressed sufficiently, and if the value is too small, the volume change becomes excessively large, and there is an adverse possibility that the calculation precision is deteriorated. In view of such circumstances, it is preferable that the Poisson's ratio defined in an element corresponding to the rubber portion of the pattern model 12 is not more than 0.499, more preferably not more than 0.495, and not less than 0.480 and more preferably not less than 0.485.

For the main body model 11, physical property values such as elastic modulus, density and vibration damping factor of rubber or cord layer of the pneumatic tire 2 can be defined as they are in accordance with convention of the finite element method.

Comparison Test 1:

A tire model was set based on the following specifications:

The number of divisions N of the main body model in the tire circumferential direction: 90

The number of divisions M of the pattern model in the tire circumferential direction: 200

The number of all elements: 67000

Tire size: 205/65R15

A thickness of a pattern model of a tire model of the Example 1 is made constant in the correcting step, but the correcting step is not carried out in Reference 1. The structures are the same except the pattern model. The tire models were used, an internal pressure was set to 200 kPa, a numerical rim 6.5 JJ was used, a vertical load was 4.5 kN, and a ground-contact pressure distribution when the tire was pushed against a flat road surface was calculated. A result thereof was visualized and shown in FIGS. 15(*a*) and 15(*b*). The ground-contact pressure is expressed by means of brightness.

Figure 15A:
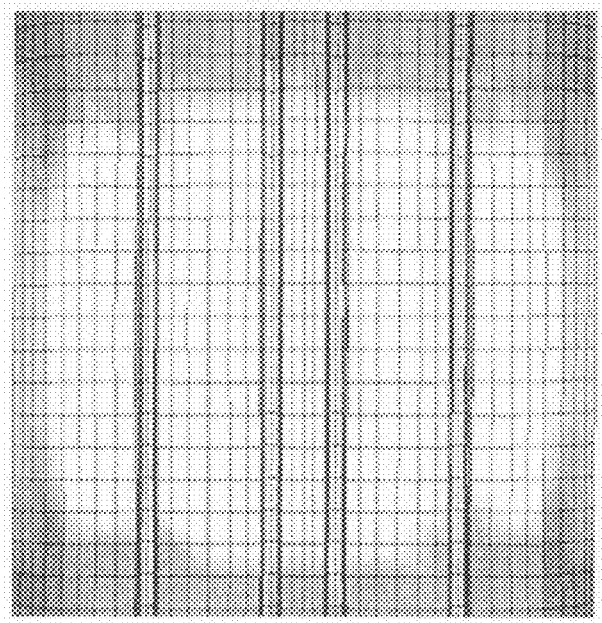
FIGS. 15(*a*) and (*b*) are diagram showing simulation results of ground-contact pressure distribution.
Figure 15B:
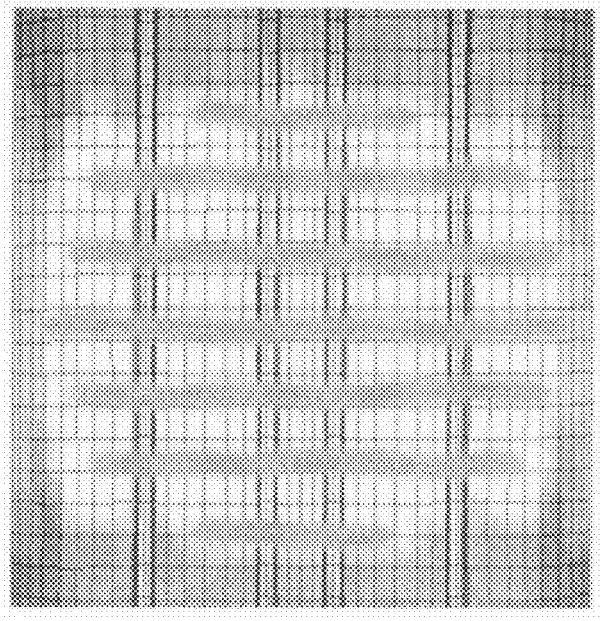

As shown in FIG. 15(*b*), it can be found that a large variation in ground-contact pressure is repeatedly generated in the tire circumferential direction in the Reference 1. On the other hand, in the Example 1, it could be confirmed that there was no variation in ground-contact pressure, and the obtained ground-contact pressure distribution of the tire was extremely close to the actual distribution.

Comparison Test 2:

Next, a vertical force and a longitudinal force acting on a tire rotation axis when the tire rode over a road having projections were simulated (calculated) using a tire model having a constant pattern model thickness and formed based on the specifications shown in Table 1. In the simulation, the rotation axis of the tire model was rotatably and freely supported, and the tire was rotated by a friction force caused by movement of the road surface with which the tire was in contact. The model forming time and calculation time were also evaluated. The size of each tire model is 205/65R15, and a tread pattern of a tire to be evaluated is as shown in FIG. 11.

In a tire model according to an Example 2, the tread groove is omitted. As shown in FIG. 13, only the longitudinal grooves of the tread grooves are formed as a model and all of lateral grooves are omitted. The rubber physical property of each element of the pattern model is corrected smaller than the physical property value of the tread rubber of the tire to be analyzed.

Figure 16:
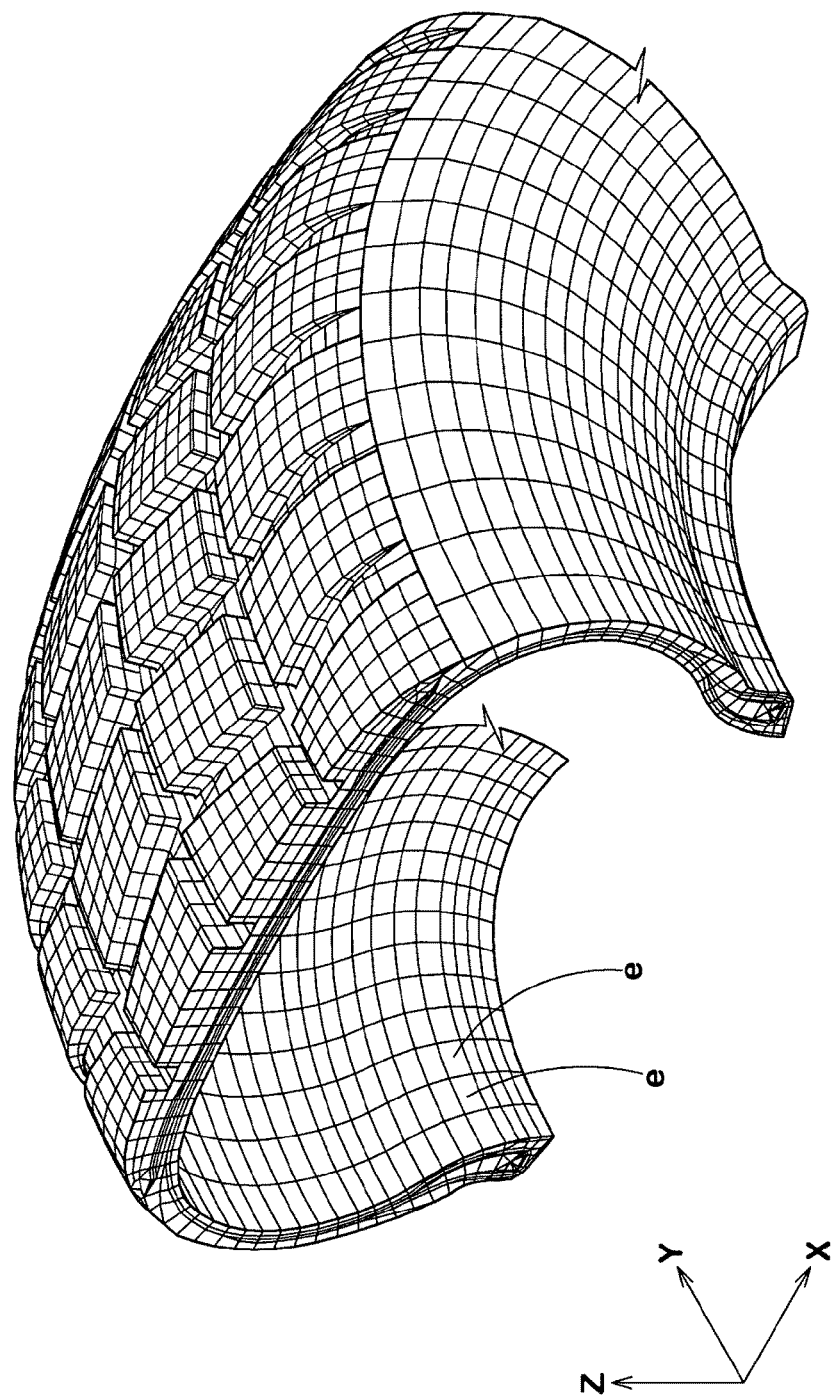
FIG. 16 is a partial perspective view of a visualized tire model according to a Reference 1.

In a tire model according to a Reference 2, as shown in FIG. 16, tread grooves (longitudinal grooves and lateral grooves) of a tire to be evaluated are faithfully reproduced.

According to a Reference 3, like the Example 2, all of lateral grooves are omitted but an original value of a rubber physical property of each element of a pattern model is defined as it is.

Simulation conditions are as follows:
Height of projection: 10 mm
width of projection: 10 mm
Running speed: 40 km/h
Internal pressure of tire model: 200 kPa
vertical load on tire model: 4.41 kN
Poisson's ratio of rubber: 0.49
Friction coefficient between tire model and road surface: 1.0

Figure 17:
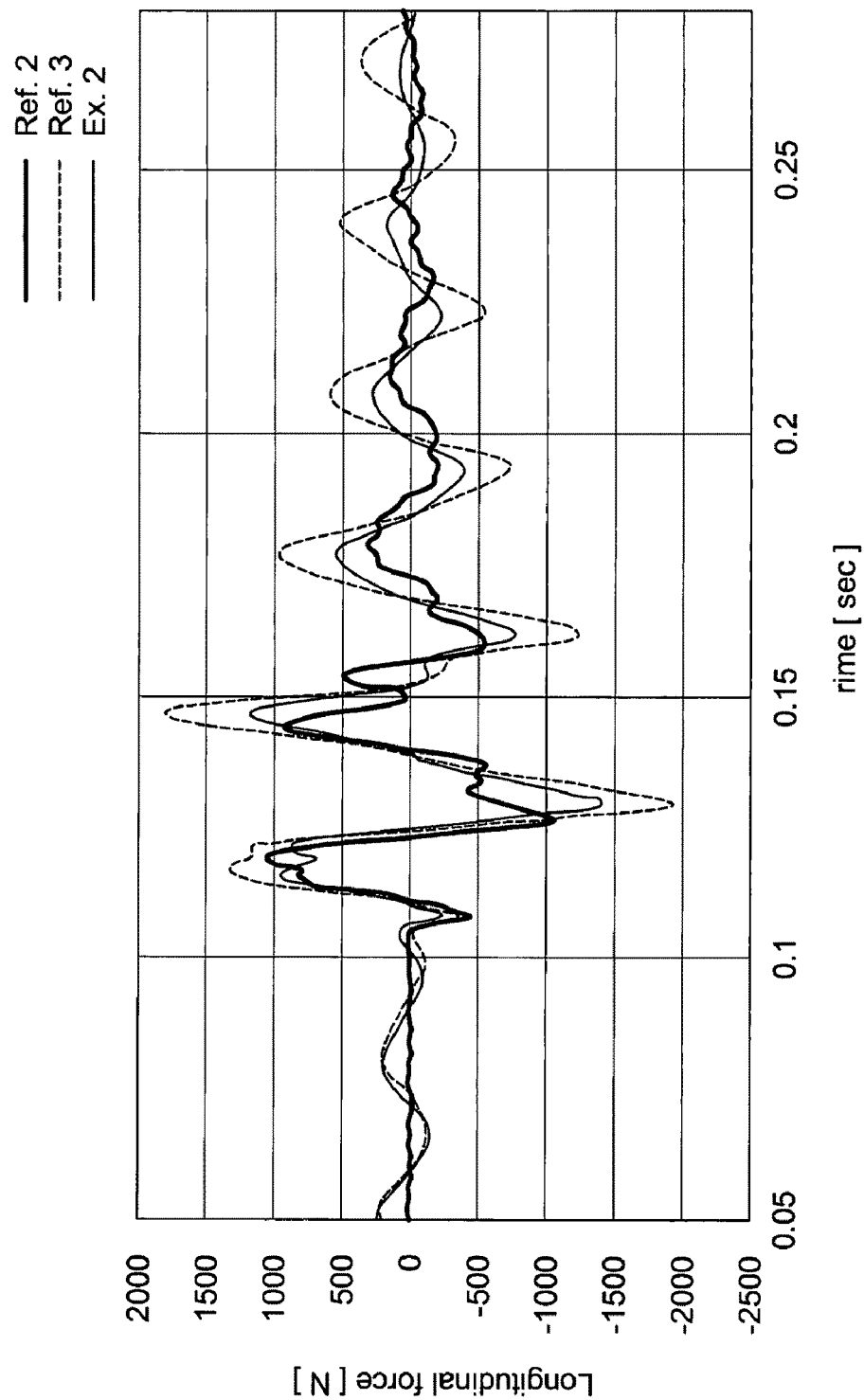
FIG. 17 is a diagram showing a simulation result and time history of a longitudinal force acting on a tire rotation axis.
Figure 18:
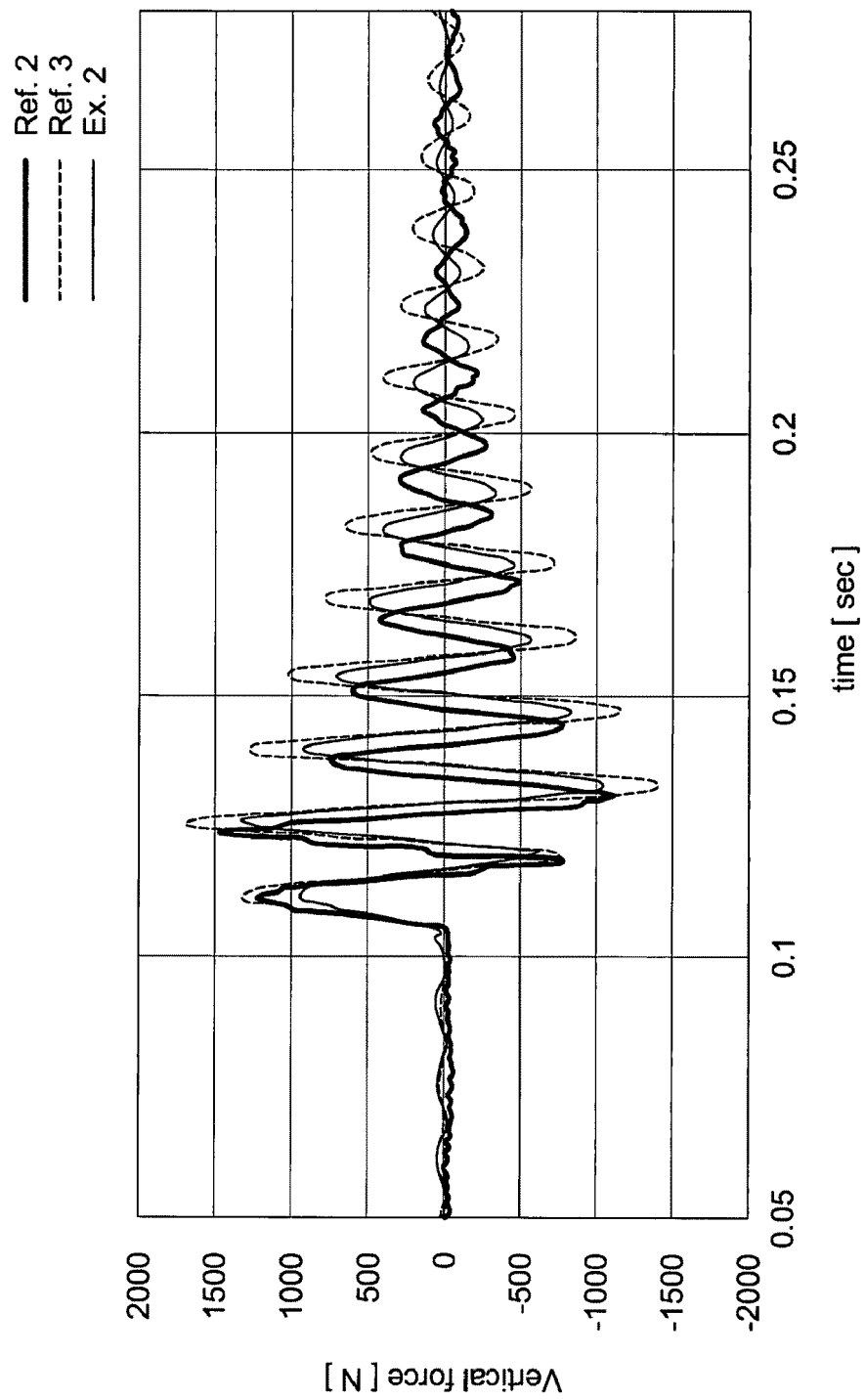
FIG. 18 is a diagram showing a simulation result and time history of a vertical force acting on a tire rotation axis.
Figure 19:
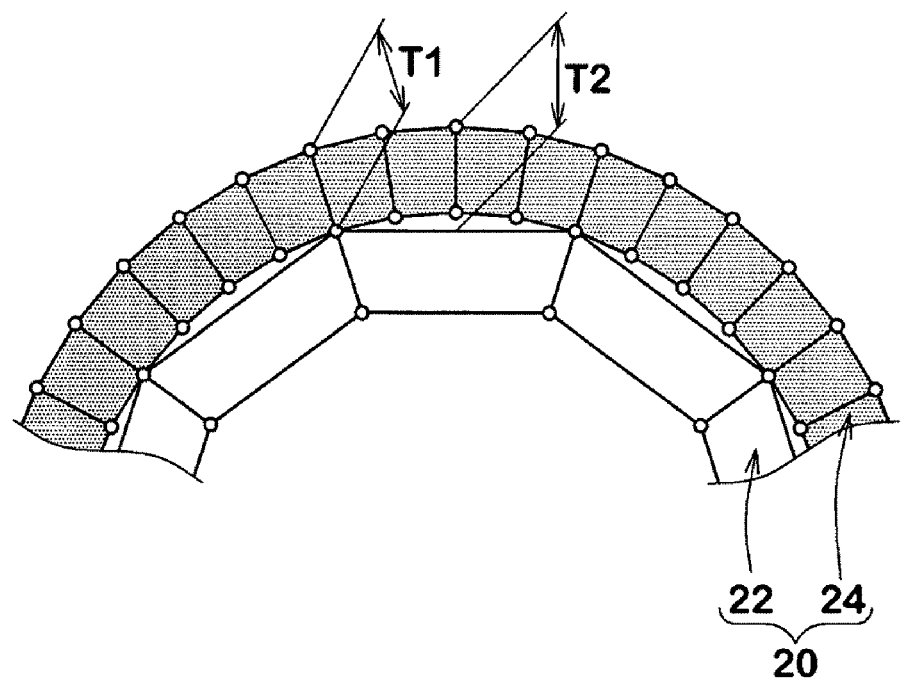
FIG. 19 is a side view of a conventional tire model.

Test results are shown in Table 1 and FIGS. 17 and 18.

TABLE 1

|  | Reference 2 | Reference 3 | Example 2 |
|---|---|---|---|
| Presence or absence of omission of tread groove | Absence | All of lateral grooves are omitted | All of lateral grooves are omitted |
| The number of elements (index) | 100 | 60 | 60 |
| $\alpha = (1 - a)/(1 - b)$ | 1.0 | 1.0 | 0.8 |
| Elastic modulus of element of pattern model (index) | 100 | 100 | 80 |
| Density of element of pattern model (index) | 100 | 100 | 80 |
| Damping factor of element of pattern model (index) | 100 | 100 | 80 |
| Modeling time (index) | 100 | 30 | 30 |
| Calculation time (index) | 100 | 80 | 80 |

* index is a value based on Reference 2 as being 100

From the test result, it could be confirmed that modeling time and calculation time of Example 2 are shorter than Reference 2. It could be confirmed from FIGS. 17 and 18 that Example 2 has excellent calculation precision as compared with Reference 3 and there was no clear difference with respect to Reference 2.

The invention claimed is:

1. A method for modeling a tire model used for a computer simulation of a pneumatic tire having a toroidal main body and a circumferentially extending tread pattern formed thereon, comprising:
    a step for setting a three-dimensional main body model by dividing the main body by N (N is an integer not less than 2) equally in a circumferential direction of the tire using a finite number of elements;
    a step for setting a three-dimensional pattern model by dividing the tread pattern by M (M is an integer greater than N) equally in the circumferential direction of the tire using a finite number of elements;
    a step for coupling the pattern model with the main body model such that their tire rotation axes are aligned to each other to make a three-dimensional tire model; and
    a correcting step for moving nodal points existing on a radially outer surface of the pattern model such that a thickness of the pattern model measured from a radially outer surface of the main body model in a normal direction becomes constant,
    wherein the correcting step includes:
        selecting one of the nodal points on the radially outer surface of the pattern model;
        calculating a radius of the selected nodal points from a tire rotation axis;
        obtaining, when an element of the body model existing radially inside of the nodal point is located at n-th position from an arbitrarily determined reference position, an angle $\theta$ of the circumferential direction of the tire from the nodal point to a boundary plane between an element of the body model located at n−1-th position from the reference position and the n-th element of the main body model,
        calculating a new radius of the nodal point to make a thickness of the pattern model constant using the angle $\theta$, and
        moving the nodal point to coordinates having the new radius.

2. The method according to claim 1, wherein
    the main body model comprises the N number of cross sections disposed at equal angles around the tire rotation axis,
    each cross section is the same shape and has nodal points at the same position, and
    said nodal points adjacent to the circumferential direction of the tire are connected to each other.

3. The method according to claim 1, wherein
    the pattern model before the correcting step comprises M number of cross sections disposed at equal angles around the tire rotation axis,
    each cross section is the same shape and has nodal points at the same position, and
    said nodal points adjacent to the circumferential direction of the tire are connected to each other.

4. The method according to claim 1, wherein
    the tread pattern of the pneumatic tire includes a tread groove having a longitudinal groove extending in the circumferential direction of the tire and a lateral groove extending in a direction intersecting with the longitudinal groove,
    the pattern model is made such that at least one of the tread grooves of the tread pattern is omitted,
    the method further includes a step for defining a rubber physical property in each element of the pattern model, and
    the rubber physical property is calculated based on a rubber physical property of the tread pattern of the pneumatic tire and a capacity of the omitted tread groove.

5. The method according to claim 4, wherein
    the pattern model is made such that all of the tread grooves of the tread pattern of the pneumatic tire are omitted.

6. The method according to claim 4, wherein
    the pattern model is set such that all of the lateral grooves of the pneumatic tire are omitted.

7. The method according to claim 4, wherein the rubber physical property includes at least one of elastic modulus, density and damping factor.

8. The method according to claim 4, wherein
the rubber physical property defined for the pattern model is calculated by multiplying the rubber physical property of the tread pattern of the pneumatic tire by a constant alpha obtained by the following equation based on the capacity of the omitted tread groove:

alpha=$(1-a)/(1-b)$ wherein, "a" is a ratio of a total capacity of the tread groove to a capacity of the entire tread pattern specified by embedding all the tread grooves in the pneumatic tire, and "b" is a total capacity ratio of the tread groove to a capacity of the entire tread pattern in the tire model.

9. The method according to claim 4, wherein a Poisson's ratio which is greater than 0 and less than 0.50 is defined for each element of the pattern model.

10. A simulation method for evaluating performance of a tire using a three-dimensional tire model, comprising:
  a step for setting a tire model using a finite number of elements which can analyze a numeric value;
  a step for providing the tire model with a condition to carry out a simulation; and
  a step for obtaining a physical quantity related to the tire through the simulation,
wherein the tire model comprises
three-dimensional toroidal main body model equally divided into N (N is an integer not less than 2) in a circumferential direction of the tire and
a three-dimensional pattern model divided into M (M is an integer greater than N) in a circumferential direction of the tire,
the main body model and the pattern model are connected such that their rotation axes are aligned to each other, and
a thickness of the pattern model measured outside from radially outer surface of the main body model in a normal direction is constant in a cross section which is in parallel to a tire equatorial plane.

* * * * *